(12) United States Patent
Cheever et al.

(10) Patent No.: US 6,512,300 B2
(45) Date of Patent: Jan. 28, 2003

(54) WATER LEVEL INTERCONNECTION

(75) Inventors: James L. Cheever, Richardson, TX (US); Charles L. Goldsmith, Plano, TX (US); John C. Ehmke, Garland, TX (US); Billy D. Ables, Richardson, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/756,801

(22) Filed: Jan. 10, 2001

(65) Prior Publication Data

US 2003/0001251 A1 Jan. 2, 2003

(51) Int. Cl.[7] ..................... H01L 23/48; H01L 23/488
(52) U.S. Cl. ................... 257/777; 257/686; 257/723
(58) Field of Search .................. 257/685, 686, 257/723, 777

(56) References Cited

U.S. PATENT DOCUMENTS

| | | | | |
|---|---|---|---|---|
| 4,825,284 A | | 4/1989 | Soga et al. | |
| 4,935,386 A | * | 6/1990 | Nakagawa et al. | ........ 148/33.5 |
| 5,164,328 A | | 11/1992 | Dunn et al. | |
| 5,417,235 A | * | 5/1995 | Wise et al. | ...................... 137/1 |
| 5,949,135 A | * | 9/1999 | Washida et al. | ............. 257/685 |
| 6,049,702 A | * | 4/2000 | Tham et al. | .................... 455/78 |
| 6,093,969 A | * | 7/2000 | Lin | ............................. 257/777 |
| 6,097,096 A | * | 8/2000 | Gardner et al. | ............. 257/758 |
| 6,307,452 B1 | * | 10/2001 | Sun | ............................. 333/262 |

FOREIGN PATENT DOCUMENTS

| | | |
|---|---|---|
| DE | 10027234 A1 | 12/2000 |
| FR | 2 780 200 | 12/1999 |
| WO | WO97/12397 | 4/1997 |

* cited by examiner

*Primary Examiner*—Allan R. Wilson
(74) *Attorney, Agent, or Firm*—Baker Botts L.L.P.

(57) ABSTRACT

RF MicroElectroMechanical Systems (MEMs) circuitry(15) on a first high resistivity substrate (17)is combined with circuitry (11) onsecond low-resisitivity substrate (13) by overlapping the first high resisitivity substrate (17)and MEMs circuitry (15) with the low resisitivity substrate(13) and circuitry (11) with the MEMs circuitry (15)facing the second circuitry (11). A dielectric lid (19) is placed over the MEMs circuitry (15)and between the first substrate (17)and second substrate (13)with an inert gas in a gap (21)over the MEMs circuitry (15). Interconnecting conductors (25,31,35, 37,39,41) extend perpendicular and through the high resistivity substrate (17)and through the dielectric lid (19) to make electrical connection with the low resisitivity substrate (13).

4 Claims, 1 Drawing Sheet

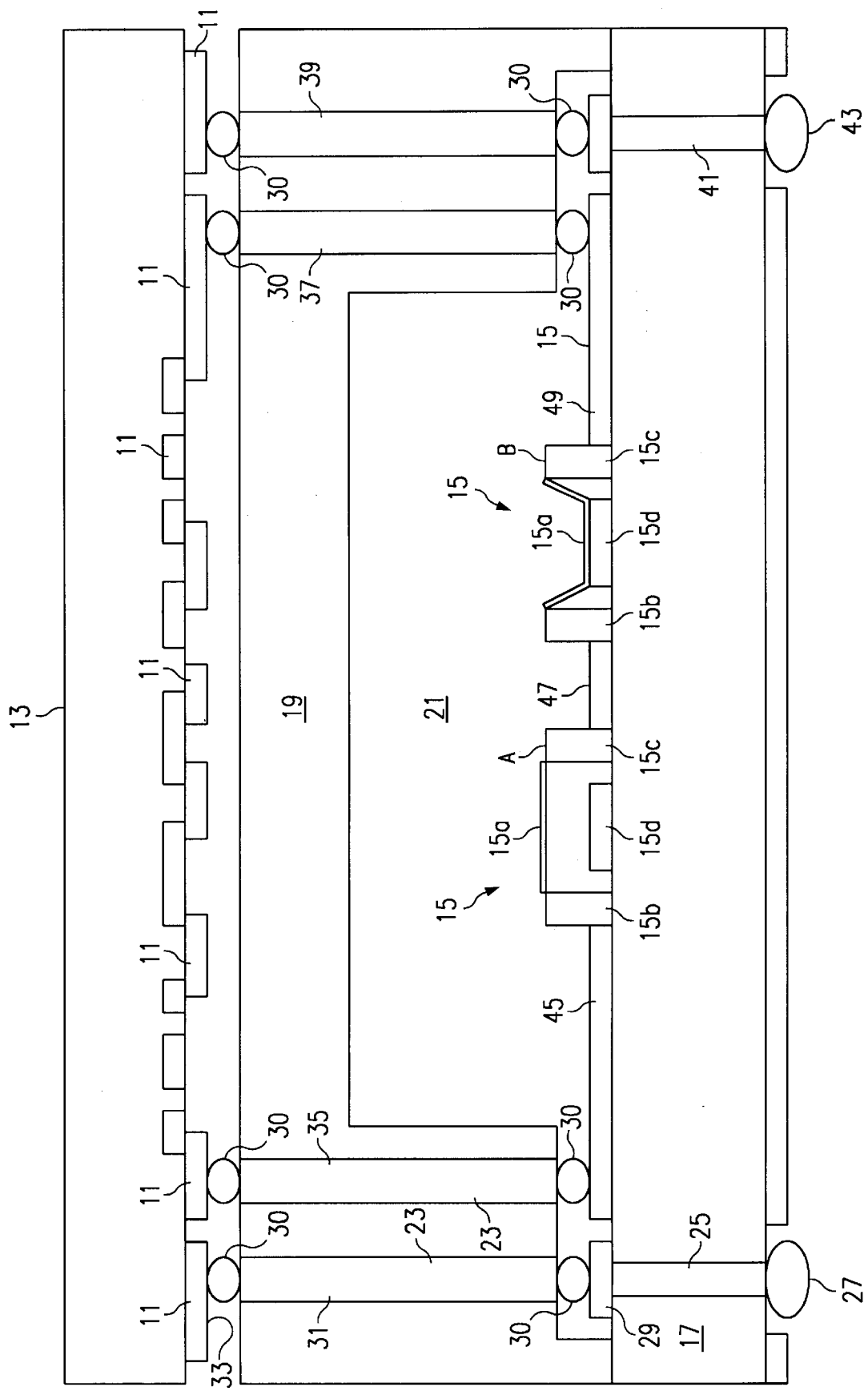

WATER LEVEL INTERCONNECTION

BACKGROUND OF THE INVENTION

1. Field of the Invention

This invention relates to RF MEMS (MicroElectroMechanical Systems) technology and more particularly to MEMS with wafer level interconnection to electronics on low-resistivity substrate material.

2. Background of Invention

RF MEMS technology has been targeted for insertion in a wide range of military applications from multi-band multi-mode communication systems to inertial navigation systems to sensors. In fact, RF MEMS technology insertion plays a major role in numerous current DARPA funded programs such as Ultra Comm and the Airborne Communications Node (ACN).

This technology could be applied to these programs plus new military insertion opportunities such as targeting systems, satellite communications, high speed tactical data link systems, electronic warfare and countermeasure systems, signal intelligence systems, and antenna systems.

This technology could also be applied to consumer electronics applications such as telecommunications (cellular telephone, back-haul, etc.) commercial aircraft, commercial radar, etc. where the distinct performance advantages and small form factor provided by the combination of RF MEMS and silicon germanium (SiGe) or other electronic circuits are desired.

This technology could also be applied to consumer electronics applications such as telecommunications (cellular telephone, back-haul, etc.) commercial aircraft, commercial radar, etc. where the distinct performance advantages and small form factor provided by the combination of RF MEMS and silicon germanium (SiGe) or other electronic circuits are desired.

Many hetero-junction technologies, epitaxial methods, and substrate materials have been considered incompatible. Specifically, RF MEMS fabrication technology has been considered incompatible with silicon germanium (SiGe) fabrication technology. RF MEMS technology requires a high resistivity substrate material to maximize the circuit RF performance. Typically SiGe circuits are processed on low resistivity material.

Raytheon has investigated the integration of RF MEMS circuitry on a low resistivity SiGe substrate using a "direct integration" (DI) approach. The primary technical challenge associated with direct integration RF MEMS circuitry with sophisticated electronics is overcoming the influence of the low-resistivity substrate material, typically used by SiGe manufacturers, on the insertion loss of the RF MEMS circuit.

Direct integration (DI) was investigated by Raytheon for overcoming the detrimental affects of the low-resistivity substrate on microwave circuitry. DI involves building a second dielectric layer on top of the substrate to serve exclusively as the microwave substrate. DI, however, has a number of technical challenges.

RF MEMS circuits produced by Raytheon require a smooth substrate. This is necessary due to the geometry of the structures being produced. The flatness of the dielectric material for the DI approach is currently unknown. Secondly, the RF performance of the circuit can be limited by the thin microwave dielectric layer.

SUMMARY OF THE INVENTION

In accordance with one embodiment of the present invention wafer level interconnect removes the requirements for substrate material as an issue. Each technology processes their circuitry on the required base material and minimizes the need for additional process development. Following initial processing, the two wafers are electrically interconnected with vertical electrical interconnections.

The wafer level interconnect invention will enable the integration of these two (and other) technologies where previously integration through wafer fabrication has been limited by a requirement for differing base substrate materials. This invention may also provide benefits for wafer level packaging of integrated circuits on silicon substrates where the electrical signal must be isolated from the substrate.

DESCRIPTION OF THE DRAWINGS

FIG. 1 is a cross sectional sketch illustrating the subject invention according to one embodiment.

DESCRIPTION OF PREFERRED EMBODIMENTS

According to one embodiment of the present invention illustrated in FIG. 1 vertical electrical interconnection between the electronics circuitry 11 on one low-resisitvity SiGe substrate 13 and RF MEMS circuitry 15 on a separate high resistivity silicon (HR) substrate 17. The low-resistivity substrate material 13 may also be silicon CMOS or gallium arsenide (GaAS) substrate. This is accomplished by using wafer fabrication techniques to construct a conductive metallization layer on either the primary (i.e., RF MEMS) substrate 17 or the secondary (i.e., other electronics) substrate 13. A dielectric lid 19 is spaced between the electronics circuitry 11 on the substrate 13 and the high resistivity substrate 17 and provides a canopy or lid over the RF MEMS circuitry 15 leaving a gap 21 over the RF MEMS circuitry 15. The gap 21 is filled with an inert environment such as a gas such as nitrogen or a vacuum. The lid 19 may be made of Pyrex, quatrz or glass and is made of a material with the same coefficient of thermal expansion as the HR substrate material 17.

The interconnection 23 includes an input/output pin terminal 27 (such as a solder ball) and a first conductive via 25 through the HR silicon substrate 17 to a conductive pad 29 on the HR substrate 17 and a second conductive via 31 through the dielectric lid 19 to a conductive pad 33 of the electronic circuitry 11 on the low resistivity substrate 13. Solder or other conductive connecting means 30 may be used to connect the opposite ends of via 31. The conductive via 25 is insulated from the HR silicon 17 by an insulating oxide. Another conductive via 35 extends from the electronic circuitry 11 down through lid 19 and conductive connecting means 30 to the RF MEMs circuitry 15 at conductor 45. There may be a connection back up to the electronics 11 through a conductive via 37 and connecting means such as solder 30 from the RF MEMs circuitry 15 back up to the electronics circuitry 11 through the dielectric lid 19. A dielectric lid (not shown) may also be over the circuitry 11 between the circuitry 15 and circuitry 11 leaving a gap 22. The dielectric lid 19 may provide both gaps.

Further, as shown, there are conductive vias 39 and 41 that extend through dielectric lid 19 and HR silicon 17 to input/output pin terminal 43. The conductive via 41 is also insulated from the HR silicon 17 by an insulating oxide. This interconnection is like that of vias 25 and 31 with solder or other connecting means 30 on either end of via 39. There may also be a connection not shown from the circuitry 15 directly to the output terminal through via 41. The terminals 27 and 43 may be surface mounted and connected to a printed circuit board. Using wafer level packaging techniques the secondary and primary substrates would then be bonded together to form both RF and DC electrical interconnections at the desire locations.

The RF MEMS circuitry 15 may be, for example, many switches like that as illustrated in the drawing for switching capacitance values. Switches A and B are illustrated. The switches A and B include a metal membrane 15a between supports 15b and 15c and a dielectric pad 15d under the membrane between the supports. When a control signal is applied, the membrane 15a contacts the dielectric pad 15d changing the capacitance value. For example, the value changes from 30 femtofarads(ff) with the unbent membrane to 3 picofarads (pf) with the membrane touches the dielectric pad 15d. The controls signals and RF from the electronics circuitry 11 are applied through the interconnecting via 35 and along connector 45 of circuitry 15 to switch A, along conductor 47 of circuitry 15 to switch B and from switch B along connector 49 of circuitry 15 to an output. In one embodiment by a connection (not shown) to via 41 to terminal 43. In another embodiment via 37 and connecting means 30 back to circuitry 11 and output from circuitry 11 or to terminal pin 43 through connector via 41 and connecting means 30. There may be a hermetic seal between the substrate 13 and the dielectric lid 19.

In the operation of the system RF and DC are applied at terminal 27. The RF and DC are applied to the electronics circuitry 11 through vias 25 and 31. The control signal for the RF MEMS switches A and B are applied through via 35 to cause the appropriate MEMs to switch capacitance. The RF signal from the electronic circuitry 11 is applied through via 35 to connector 45 and propogated through the switches A and B to the input/output pin 43 or other outputs (not shown) as discussed above. The electronics circuitry 11 may include an amplifier and the input to or output from the amplifier is filtered according to the capacitance values determined by the MEMS switches such as switches A and B.

Based upon past reviews of literature relating to wafer fabrication and RF MEMS, RF MEMS technology has never before been integrated with integrated circuits fabricated on a separate wafer. Furthermore, no article: have been observed relating to vertical electrical interconnection of two wafers using wafer fabrication techniques.

What is claimed is:

1. A semiconductor for coupling a first and a second substrate, the semiconductor comprising:
    a first substrate that includes a high resistivity material and that is coupled to a first circuitry;
    a second substrate that includes a low resistivity material and that is coupled to a second circuitry; and
    a plurality of interconnecting conductors that each extend to said first and second substrates such that an electrical coupling is provided between said first and second circuitries; and
    a dielectric lid positioned between said first and second circuitries and operable to define operational space between said first and second substrates, wherein said interconnecting conductors extend through said dielectric lid and said dielectric lid defines a gap between said first circuitry and said dielectric lid, and wherein said gap is an inert environment.

2. A semiconductor for coupling a first and a second substrate, the semiconductor comprising:
    a first substrate that includes a high resistivity material and that is coupled to a first circuitry;
    a second substrate that includes a low resistivity material and that is coupled to a second circuitry;
    a plurality of interconnecting conductors that each extend to said first and second substrates such that an electrical coupling is provided between said first and second circuitries; and
    a dielectric lid positioned between said first and second circuitries and operable to define operational space between said first and second substrates, wherein said interconnecting conductors extend through said dielectric lid and said dielectric lid defines a gap between said first circuitry and said dielectric lid, and wherein said gap is an inert environment that comprises nitrogen gas.

3. A semiconductor for coupling a first and a second substrate, the semiconductor comprising:
    a first substrate that includes a high resistivity material and that is coupled to a first circuitry;
    a second substrate that includes a low resistivity material and that is coupled to a second circuitry;
    a plurality of interconnecting conductors that each extend to said first and second substrates such that an electrical coupling is provided between said first and second circuitries; and
    a dielectric lid positioned between said first and second circuitries and operable to define operational space between said first and second substrates, wherein said interconnecting conductors extend through said dielectric lid and said dielectric lid defines a gap between said first circuitry and said dielectric lid, and wherein said gap is an inert environment that is a vacuum.

4. A semiconductor for coupling a first and a second substrate, the semiconductor comprising:
    a first substrate that includes a high resistivity material and that is coupled to a first circuitry;
    a second substrate that includes a low resistivity material and that is coupled to a second circuitry;
    a plurality of interconnecting conductors that each extend to said first and second substrates such that an electrical coupling is provided between said first and second circuitries; and
    a dielectric lid positioned between said first and second circuitries and operable to define operational space between said first and second substrates, wherein said interconnecting conductors extend through said dielectric lid and said first substrate.

* * * * *

UNITED STATES PATENT AND TRADEMARK OFFICE
CERTIFICATE OF CORRECTION

PATENT NO.     : 6,512,300 B2
DATED          : January 28, 2003
INVENTOR(S)    : James L. Cheever et al.

It is certified that error appears in the above-identified patent and that said Letters Patent is hereby corrected as shown below:

<u>Title page,</u>
Item [54], delete "WATER" and insert -- WAFER --.

Signed and Sealed this

Tenth Day of February, 2004

JON W. DUDAS
*Acting Director of the United States Patent and Trademark Office*